(12) United States Patent
Smith et al.

(10) Patent No.: US 9,768,562 B2
(45) Date of Patent: Sep. 19, 2017

(54) MODIFIED ELECTRICAL DEVICES

(71) Applicants: Jeremy C Smith, Orem, UT (US); Sean D Watkins, Spanish Fork, UT (US); Martin Johnson, Draper, UT (US)

(72) Inventors: Jeremy C Smith, Orem, UT (US); Sean D Watkins, Spanish Fork, UT (US); Martin Johnson, Draper, UT (US)

(73) Assignee: Snap Rays LLC, Vineyard, UT (US)

( * ) Notice: Subject to any disclaimer, the term of this patent is extended or adjusted under 35 U.S.C. 154(b) by 12 days.

(21) Appl. No.: 14/678,746

(22) Filed: Apr. 3, 2015

(65) Prior Publication Data

US 2015/0229079 A1    Aug. 13, 2015

Related U.S. Application Data

(63) Continuation of application No. 14/066,637, filed on Oct. 29, 2013, now Pat. No. 9,035,181, which is a continuation-in-part of application No. 13/461,915, filed on May 2, 2012, now Pat. No. 8,912,442.

(60) Provisional application No. 61/720,131, filed on Oct. 30, 2012, provisional application No. 61/778,386, filed on Mar. 12, 2013, provisional application No. 61/836,972, filed on Jun. 19, 2013, provisional application No. 61/574,344, filed on Aug. 1, 2011.

(51) Int. Cl.
*H01R 13/66* (2006.01)
*H05K 5/03* (2006.01)
*H02G 3/14* (2006.01)
*G05F 3/02* (2006.01)

(52) U.S. Cl.
CPC .......... *H01R 13/6675* (2013.01); *G05F 3/02* (2013.01); *H02G 3/14* (2013.01); *H05K 5/03* (2013.01)

(58) Field of Classification Search
USPC ........................................................ 174/66
See application file for complete search history.

(56) References Cited

U.S. PATENT DOCUMENTS

| | | | |
|---|---|---|---|
| 6,774,328 B2 * | 8/2004 | Adams | H05B 39/00 200/329 |
| 7,273,983 B1 * | 9/2007 | Rintz | F21S 8/035 174/66 |
| 7,576,285 B1 * | 8/2009 | Savicki, Jr. | H02G 3/14 174/53 |
| 8,668,347 B2 * | 3/2014 | Ebeling | H01R 13/5213 174/66 |

* cited by examiner

*Primary Examiner* — Dhirubhai R Patel

(57) ABSTRACT

In one example, a modified electrical device includes a body and at least one connector on the body to make power and control connections with an active cover plate. A system includes an active cover plate with low voltage circuitry and a first interface and a modified electrical device. The modified electrical device includes high voltage circuitry and a second interface to connect to the first interface to supply low voltage to the active cover plate. A method for controlling a flow of power through a modified electrical device is also provided.

17 Claims, 14 Drawing Sheets

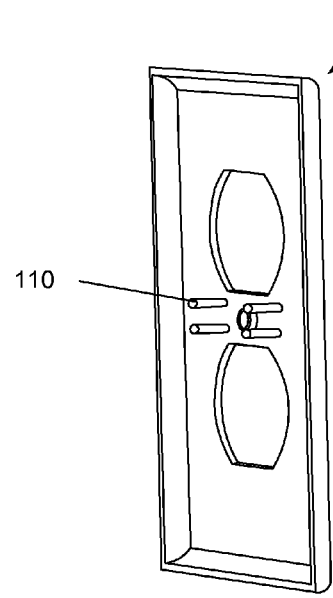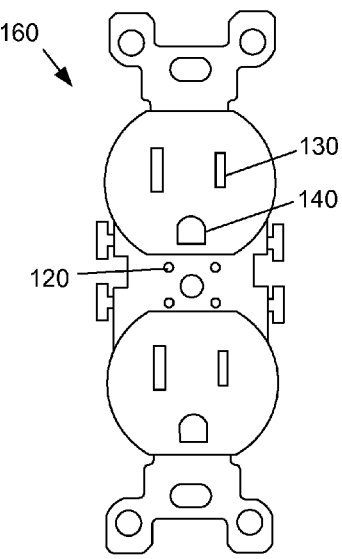
*Fig. 1A*  *Fig. 1B*
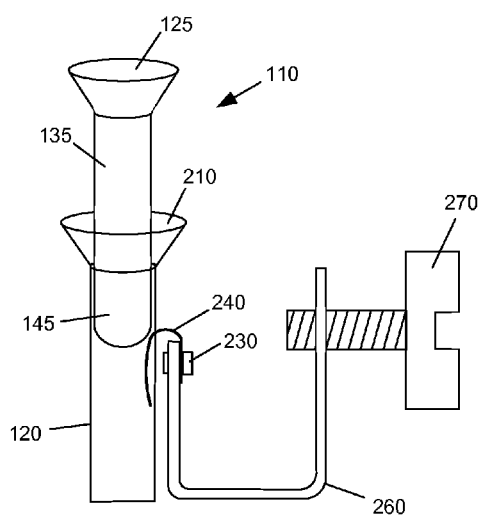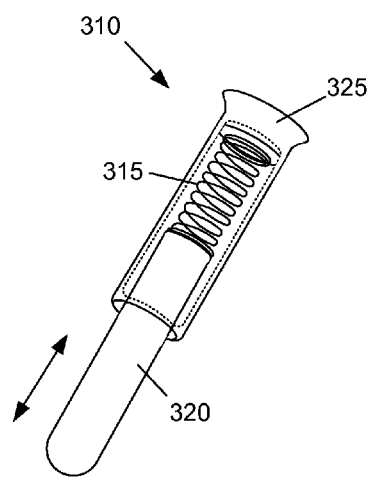
*Fig. 2*  *Fig. 3*

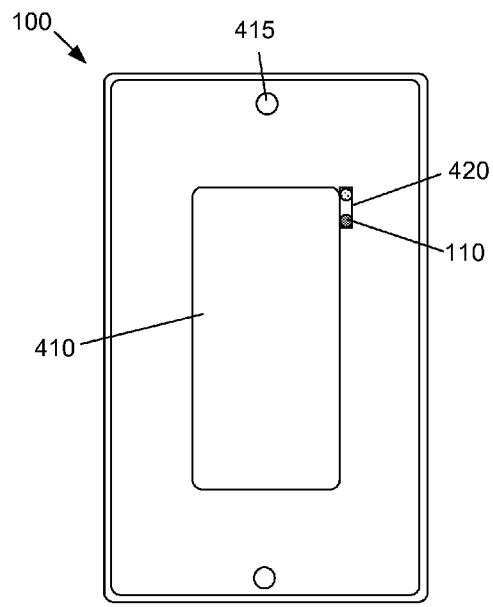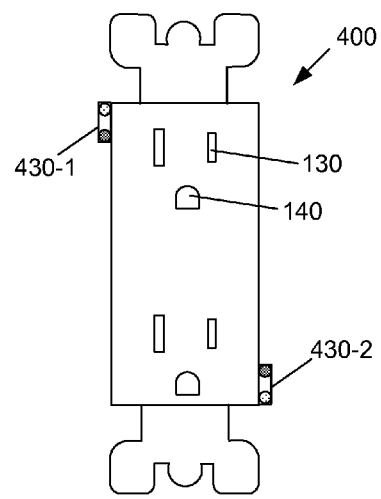
*Fig. 4A*  *Fig. 4B*
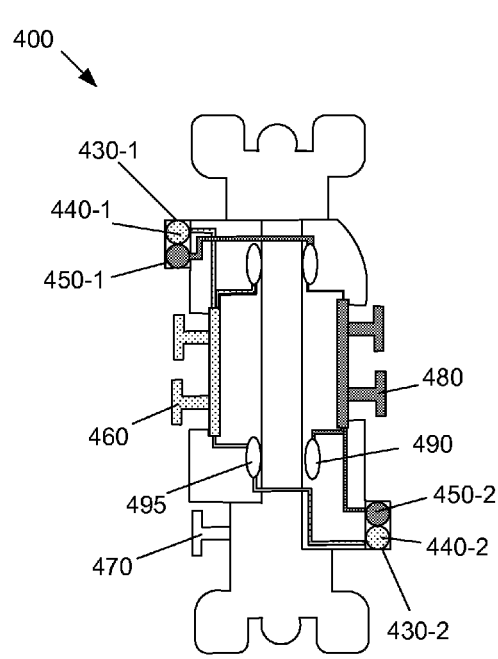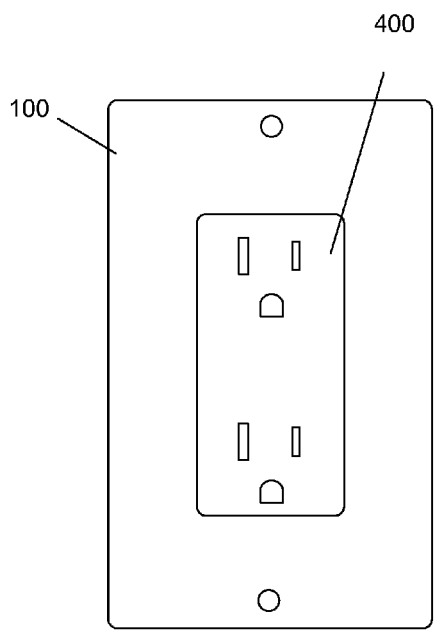
*Fig. 4C*  *Fig. 4D*

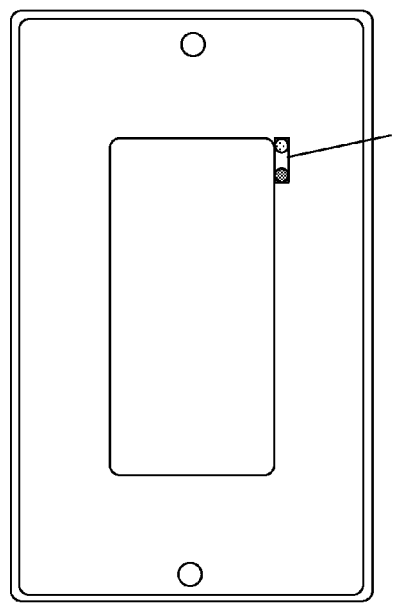
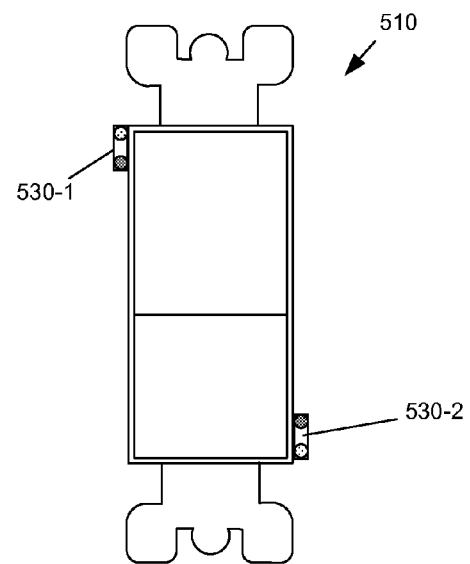
*Fig. 5A*  *Fig. 5B*
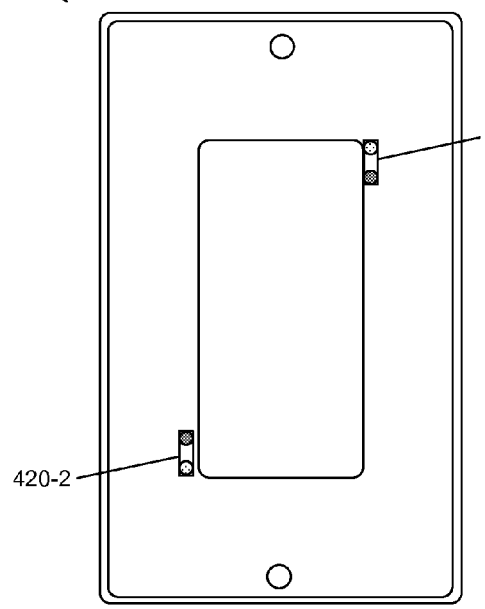
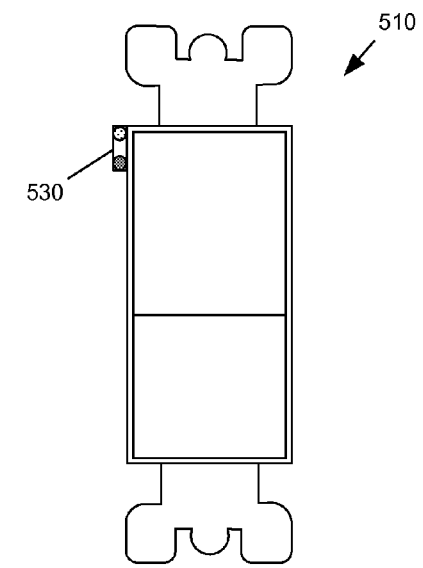
*Fig. 5C*  *Fig. 5D*

MODIFIED ELECTRICAL DEVICES

RELATED APPLICATIONS

The present application is a continuation, and claims the benefit under 35 U.S.C. §120, of U.S. application Ser. No. 14/066,637, filed Oct. 29$^{th}$, 2013, now U.S. Pat. No. 9,035,181, which claims priority under 35 U.S.C. §119(e) to U.S. Provisional Application No. 61/720,131, filed Oct. 30, 2012; U.S. Provisional Application 61/778,386, filed Mar. 12, 2013; and U.S. Provisional Application 61/836,972, filed Jun. 19, 2013, which applications are incorporated by reference in their entireties. U.S. application Ser. No. 14/066,637 also is a continuation-in-part, and claims the benefit under 35 U.S.C. §120, of U.S. application Ser. No. 13/461,915, filed May 2, 2012, now U.S. Pat. No. 8,912,442, which claims the benefit under 35 U.S.C. §119(e) of U.S. Provisional Application No. 61/574,344, filed Aug. 1, 2011. These applications are hereby incorporated by reference in their entireties.

BACKGROUND

Outlets and switches are electrical devices that are a part of modern homes. Outlets are wall mounted devices with receptacles that supply power when prongs of a cord are inserted into the receptacles. Switches are wall mounted devices that control the flow of electrical power to various lights, appliances, etc. For example, a switch may control the flow of electrical power to a ceiling mounted light or fan.

Outlets and switches are typically installed during construction, remodeling, or maintenance of a home or building. To install outlets and switches, an electrical box is mounted to a stud or other structural portion of the building. Electrical wiring is routed to the electrical box. The electrical wiring is connected to an electrical power source such as the residential grid or a local power source such as a photovoltaic array/battery. The wall covering (such as drywall or paneling) is then placed over the wall with an opening that exposes the interior of the electrical box. The outlet or switch body is then connected to the electrical wiring and secured to the electrical box. These connections can be made in a variety of ways, including using stab-in connectors on the back of the outlet/switch or using screw terminals on the sides of the outlet/switch.

A cover plate (also known as a "wall plate") is then attached over the opening in the wall covering. Cover plates are typically held in place by one or more screws that pass through the cover plate and screw into the outlet body, switch body, or other electrical device. The cover plate serves a number of purposes, including covering the electrical connections between the building wiring and electrical device and covering the opening in the wall. When in place, the cover plates give a finished appearance to the wall. The cover plates are typically made from a piece of molded plastic that has appropriate openings to expose the switch lever and/or receptacles.

BRIEF DESCRIPTION OF THE DRAWINGS

The accompanying drawings illustrate various examples of the principles described herein and are a part of the specification. The illustrated examples are merely examples and do not limit the scope of the claims.

FIGS. 1A and 1B show an illustrative modified electrical device and a mating active cover plate, according to one example of principles described herein.

FIG. 2 shows an interconnection between a male prong and a female port, according to one example of principles described herein.

FIG. 3 shows a prong with a spring loaded tip, according to one example of principles described herein.

FIGS. 4A-4D show one example of an electrical system that includes an active cover plate and a modified electrical device, according to one example of principles described herein.

FIGS. 5A-5D show examples of electrical systems that include an active cover plate and a modified decora switch body, according to one example of principles described herein.

Throughout the drawings, identical reference numbers designate similar, but not necessarily identical, elements.

DETAILED DESCRIPTION

Figure 6A:
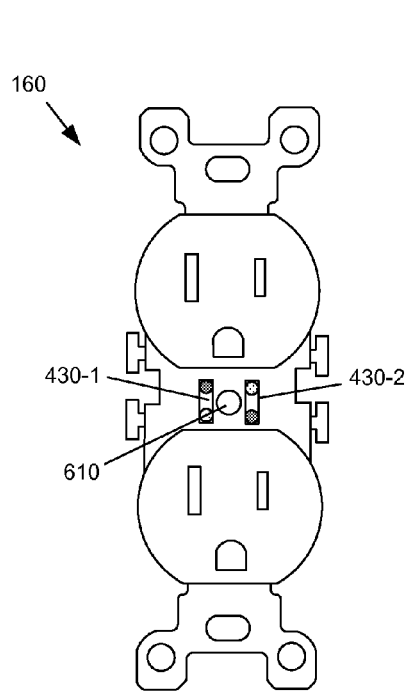
FIGS. 6A and 6B shows one example of an electrical system that includes an active cover plate and a modified duplex outlet, according to one example of principles described herein.

Modified electrical devices ("MEDs") are any energized device that is designed to supply or control power or to supply electrical signals and is also configured to receive an active cover plate. For example, modified electrical devices may be an outlet or switch bodies that are modified to power and communicate with an active cover plate. An active cover plate is a cover or wall plate that contains electrical components or supplies functionality that is not available in a traditional wall or cover plate. The active cover plate may obtain electrical energy from a variety of sources, including outlet or switch bodies. Additionally or alternatively, the active cover plate may be battery powered or powered wirelessly. The active cover plates may include functional elements such as lights, sensors, input/output devices, and communication elements. For example, an active cover plate mounted to an outlet in a room may include a number of light emitting diodes (or other light generating elements) and a light sensor. When the room is illuminated, the light sensor turns the light emitting diodes off. When the room is dark, the light sensor turns the light emitting diodes on. The active cover plate may supply electrical power to the light emitting diodes from the outlet body or a battery. For example, during normal operation, the active cover plate may interface with the outlet body (or switch body) to extract power from the building wiring. However, when there is no electrical power in the building wiring, the active cover plate may draw on a battery for power to illuminate the light emitting diodes.

A variety of elements may be included in an active cover plate, including sensors such as temperature sensors, humidity sensors, smoke detectors, motion detectors, microphones, radon detectors, cameras, and a variety of other sensors. The active cover plates may include input/output elements such as additional switches, touch sensitive elements, microphones, display screens, speakers or other elements. The active cover plates may also include communication elements such as wireless communication circuits (such as BLUETOOTH, ZIGBEE, cellular circuits) or wired communication circuits (such as communication over power line technology). For example, in some embodiments the active cover plate may function or interface with a thermostat. The active cover plate may include a temperature sensor and communicate with a home automation system or thermostat to control the temperature of a room or rooms. In some instances the thermostat setting in the room or an extended area may be altered through an interface on a cover plate. Additionally, the active cover plates in a building may act as a sensor network that learns behavior patterns of the occupants and may anticipate their needs based on past behavior.

The interface between the active cover plate and the device body that allows for the extraction of power out of the building wiring may take a variety of forms, including wired interfaces or wireless interfaces. Wireless interfaces have a number of advantages, including the potential for a sealed cover plate with no exposed electrical contacts. Wired interfaces have a number of advantages including almost lossless energy transfer, simplicity, cost effectiveness and the ability to transfer large amounts of electrical energy if desired.

The description below focuses on, but is not limited to, modified electrical devices that incorporate additional electrical interfaces that are specifically designed to power an active cover plate. These interfaces are "wired" interfaces where conductive elements in the active cover plate are brought into contact with mating conductive elements in the device body. Electrical power is transferred through the contacting conductive elements to power the functionality of the cover plate.

There are a number of design considerations that can be taken into account when designing a modified electrical device for powering an active cover plate. For example, in some implementations there may not be a preferred orientation for installing a device body (i.e the outlet or switch body). The device body may be installed right-side up or upside down. If there is a preferred orientation for the active cover plate, the device body/active cover plate may be designed to connect to the modified device body in either its upside down or right side up orientation. For example, if the active cover plate includes a nightlight, it may be desirable for the nightlight to be pointed downward to illuminate the floor rather than upward. Consequently, the active cover plate should be able to connect to modified outlet bodies that are right side up or upside down with the active cover plate remaining upright with the nightlights pointing downward. For active cover plates that do not have a preferred orientation, the ability to connect the active cover plate in both the upside down and right side up orientations can still simplify installation.

In addition to power connections, the modified electrical devices may also include communication connections between the active cover plates and the modified electrical devices. For example, the communication ports may allow for control of a relay inside the modified electrical device or other communication between the active cover plate and the modified electrical device it is connected to.

Ideally, the interface between the modified electrical device and the active cover plate would be self-aligning, mechanically robust, and electrically reliable. For example, one consideration in making a connection between the modified electrical device and an active cover plate is that there may be a variable distance between the modified electrical device and the cover plate. The electrical box may be mounted at varying depths on the stud and the wall covering may have variable thickness. However, the active cover plate is mounted flush with the exterior of the wall covering. Thus there can be a variable distance between the active cover plate and the modified electrical connections. Various designs below account for these and other factors to produce modified electrical outlets and active cover plates that are easy to install, versatile, and reliable.

In the following description, for purposes of explanation, numerous specific details are set forth in order to provide a thorough understanding of the present systems and methods. It will be apparent, however, to one skilled in the art that the present apparatus, systems, and methods may be practiced without these specific details. It is understood that the figures are diagrammatic and schematic representations of some embodiments of the invention, and are not limiting of the present invention, nor are they necessarily drawn to scale. Reference in the specification to "an example" or similar language means that a particular feature, structure, or characteristic described in connection with the example is included in at least that one example, but not necessarily in other examples. Features shown and/or described in connection with one figure may be combined with features shown and/or described in connection with other figures.

In general, the terms "active cover plate," "active wall plate," or "interactive cover plate" are used broadly to include anything that is not plugged into the designated outlet receptacles themselves, but is something that is still powered by the outlet in any other way except being powered by the original designated receptacles. An active cover plate allows original designated receptacles and switches to still be accessible. Also it does not matter how the wall plate is attached to the outlet whether it be with a screw, snapped in, magnetic connections, or any other way. For example, the cover plate may have high strength magnets that are attracted to metal in the outlet or outlet box (such as the metal brackets that are used to connect the outlet to the outlet box). The cover plate may simply be placed over the outlet and be held in place by magnetic attraction between the magnets in the cover plate and the brackets on the outlet.

The term "human interface element" refers to any components on an installed device body (e.g. switch/outlet body) that are designed for a human to interface with. For example, human interface elements may include plug in receptacles that are designed for a human to press prongs of an electrical cord into. Other types of human interface elements include toggle switches, buttons, sliders, touch screens, displays and other components that a human touches, manipulates, or manipulates another object into contact with. In general, active cover plates installed over outlet/switch bodies leave human interface elements of the outlet/switch bodies exposed and accessible for human interaction. In one example, an active cover plate may be installed over a duplex outlet body. Both outlet receptacles ("human interface elements") can be exposed through the active cover plate. However, in some embodiments the active cover plate may cover or replace some of the human interface elements on an outlet body.

The term "NEMA receptacle" refers to the blade or blade/prong configurations defined by U.S. National Electrical Manufactures Association (NEMA) 5-15R standard. NEMA receptacles are the standard electrical outlet found in almost every home and building in the United States. Similar and interchangeable connectors are used in Canada and Mexico. NEMA 1 connectors have two blades while NEMA 5 connectors have two blades and a ground prong. The dimensional standard for these electrical connectors is ANSI/NEMA WD-6.

As discussed above, an outlet or switch may be used as a source of power for an active cover plate. For simplicity, an outlet, switch, or other interface with building electrical wiring will be called "an electrical device". The electrical devices may be modified, changed, or customized in a variety of ways to accommodate powering of the active cover plate.

The term "building wiring" refers to a range of electrical wiring that carries electrical power through a structure to outlets/switches for use/control by a user. For example, "building wiring" refers to electrical wiring in homes, businesses, commercial buildings, schools, and other structures. The building wiring may carry a range of voltages depending on the electrical system the building wiring is connected to and the standard of the country the building wiring is used in. For example, building wiring may have voltages of 100, 110, 115, 120, 127, 208, 220, 230, 240, 277 and 480 volts with frequencies of 60 or 50 hertz. Other building wiring systems may utilize DC voltages.

A variety of electrical devices can be modified to provide connectivity to an active cover plate. For example, electrical devices that could be modified include decora light switches, duplex light switches, ganged light switches, outlet and switch combinations, outlets/switch that include USB ports, ground fault circuit interrupter (GFCI) outlets, surge protector outlets, arc-fault outlets, relay switch type outlets (such as ZIGBEE enabled outlets), single outlets, keyed/locking outlets, and a variety of other outlets and switches.

The modified electrical device may include internal circuitry to step down the input voltage from the building electrical wiring. For example, the input voltage may be 120 volts, 240 volts or some other standard input voltage. Electronics, such as coils, diodes, transformers, rectifiers, resistors, capacitors or other electronic components may be included inside the modified electrical device itself. These electronics may step down the voltage for use by the active cover plates. For example, the lower voltage may be a voltage between 1 and 36 volts. This output voltage may be selected to be the highest voltage that an active cover plate may require. Alternatively, the output voltage may be designed to specifically supply a desired voltage for a particular active cover plate. The active cover plate may further reduce this voltage if necessary. In some examples, part of the cover plate may operate at a first voltage and other parts of the cover plate may operate at a different voltage. For example, the output voltage from the electrical circuitry may be 12 volts and the cover plate may use 12 volts to power an external device that is connected to the cover plate (such as a security system) while the other parts of the cover plate may use 2 to 4 volts to power nightlights.

Active cover plates could make electrical connections to the outlet/switch bodies in a variety of ways. For example, the outlet/switch body may include an electrical contact on a surface. The active cover plate has corresponding contacts. When the active cover plate is fastened over the outlet/switch body, the contacts meet and the active cover plate receives electrical power from the outlet/switch body. In other examples, the outlet/switch body may communicate power/signals to the cover plate wirelessly.

In one implementation, the modified outlet/switch body may include a number of female ports that are incorporated into the bodies of the outlets/switches. For each design, the active cover plate has a corresponding pattern of prongs that are configured to interface with all or a portion of the ports. In most cases, the connection between the active cover plate and the outlet is configured so that the outlet/switch can be installed right side up or upside down without adversely affecting the cover plate performance. The female ports on the outlet/switch body and the prongs on the cover plate can be located in any convenient location that is safe and functional. Although circular prongs and female ports are shown in the figures, the prongs/ports could have a variety of configurations, including rectangular or square blades.

FIG. 1A shows an active cover plate (100) for a duplex outlet with four prongs (110) extending rearward from the back surface of the cover plate. These prongs (110) are electrically connected to internal circuitry in the active cover plate (100). FIG. 1B shows one example of a modified electrical device (160) with female receptacles or ports (120) that correspond to the prongs (110, FIG. 1A) on the active cover plate (100, FIG. 1A). When the active cover plate (100) shown in FIG. 1A is fastened over the modified electrical device (160), the prongs (110, FIG. 1A) interface with the female ports (120) and transfer electrical power from the modified electrical device (160) to the circuitry in the active cover plate (100, FIG. 1A). In this example, the modified electrical device is a duplex outlet body. As discussed above, the outlet body (160) may be mounted right side up (with slots (130) in the outlet above the ground aperture (140) as shown in FIG. 1B) or the outlet body (160) may be mounted upside down (with the slots (130) in the outlet face below the ground aperture (140). Either orientation is operable. The active cover plate (100, FIG. 1A) may or may not have a preferred orientation. For example, if the active cover plate (100, FIG. 1A) is designed for illumination, the active cover plate (100, FIG. 1A) may need to be oriented in a particular direction to have the light emitted in the desired direction. For maximum versatility, the active cover plate (100, FIG. 1A) can be designed to connect in the desired orientation to outlet bodies that are right side up or upside down. In some examples, only two of the prongs (110, FIG. 1A) may need to make contact to form the desired interface with the outlet body (160). Current flow through the other two prongs (110, FIG. 1A) can be blocked in a variety of ways, including using diodes.

The configurations described above are only illustrative. The prong/port (110/120) configurations and arrangements may take any suitable form.

FIG. 2 shows additional details of one technique for making electrical contact between a prong (110) and a female port (120) in an outlet body. The prong (110) may include a support/base (125), a conductive body (135), and a tip (145). For clarity, the connection between the prong (110) and the active cover plate (100, FIG. 1A) is not shown in this example. In this example, the prong (110, FIG. 1A) is axially symmetric and includes a conical support/base (125), a conductive body (135), and a tip (145) with a 180 degree radius. The conductive body (135) in this example is a tubular copper/brass body. The support/base (125) provides mechanical stability to the prong (110) and allows for a larger cross sectional area to be connected to the back of the active cover plate (100, FIG. 1A). The copper/brass conductive body (135) extends away from the support/base (125) and terminates at the tip (145). The rounded tip (145) may provide a number of advantages including guiding the prong (110) into a matching female receptacle or port (120).

The male prong (110) is inserted into the female port (120). The female port (120) may include a funnel shaped opening ("guide") (210) that is designed to interact with a tip (145) of a prong to guide the prong (110) into alignment with a central cavity of the female port (120). As the tip (145) of the male prong enters the central cavity of the female port (120), it is pressed against the electrical contact (240). This particular design is configured to make electrical contact even when the male prong (110) is only partially inserted (as shown in FIG. 2) and also to make electrical contact when the male prong (110) is completely inserted. This can be advantageous because there may be a variable distance between the active cover plate (100, FIG. 1A) and the outlet body (160, FIG. 1B). As discussed above, this variable distance can result from the modified outlet body (160, FIG. 1B) being mounted at different depths with respect to the outer surface of the wall covering. By allowing the male prong (110) to make electrical contact with the wire when the male prong (110) is only partially inserted into the female port (120), these variable distances can be accommodated and the connection can be more robust.

FIG. 2 also shows a diagram of the electrical components in an outlet or switch body that are used to connect the building wiring to the electrical contact in the female port (120). In this example, there is a direct electrical connection between the building wiring and the female port (120). The screw (270) is on the exterior of the outlet body (160, FIG. 1B) and passes through a threaded hole in the conductive strip (260). The building wiring is placed between the head of the screw and the conductive strip (260) and the screw (270) is tightened to sandwich the building wiring between the head of the screw (270) and the conductive strip (260). An electrical contact (240) is connected to the conductive strip (260). The connection (230) may be formed in any of a variety of ways, including pressing, soldering, or riveting the conductive strip (260) to the electrical contact (240). The electrical contact (240) extends into the cavity of the port (120) to make an electrical connection with an inserted male prong (110).

FIG. 3 shows an alternative embodiment of a prong (110) shown in FIG. 1. In this example, the prong is a spring loaded prong (310) that includes a base (325) that has a cavity through its center. A spring (315) is contained within the cavity. One end of a plunger (320) interfaces with the spring (315), which exerts a force that tends to push the plunger (320) out of the cavity. The spring loaded prong (310) may have a number of advantages including a greater range of contact with the female port (120, FIG. 1B).

A variety of other prong designs could be used. For example, the prong may have a square or rectangular cross section. In one example, the prong may incorporate spring elements that press outward against the walls of the female port.

FIGS. 4A-4D show one example of an active cover plate (100) and modified electrical device (400) designed to interface with the active cover plate (100). In this example, the active cover plate (100) and modified electrical device (400) have a "decora" style. The decora style includes a single rectangular outlet face that includes two NEMA type receptacles ("human interface elements"). Each NEMA style receptacle includes two slots (130) and a ground opening (140).

The active cover plate shown in FIG. 4A is a rear view. In this example, the active cover plate (100) includes an aperture (410) to receive the rectangular outlet face, through holes (415) to accept screws to secure the active cover plate (100) over the modified electrical device (400), and a 2-port connector (420). The 2-port connector (420) in this rear view is located at the upper right hand side of the aperture (410). The 2-port connector (420) includes two prongs (110).

The modified electrical device (400) shown in FIG. 4B includes two 2-port connectors (430): Connector A (430-1) and Connector B (430-2). When the decora outlet body (400) and the active cover plate (100) are both in the right side up configuration, the cover plate connector (420) will interface with connector A (430-1) on the outlet body. When either the active cover plate (100) or the decora outlet body (400) is upside down, the cover plate connector (420) will interface with connector B (430-2). Consequently, the active cover plate (100) can be connected in the desired orientation regardless of the orientation of the decora outlet body (400).

FIG. 4C is a cutaway front view of a decora outlet body (400) showing the electrical connections between the screw terminals (460, 470, 480), the NEMA connectors (440, 450), and the 2-port connectors (430). The screw terminal on the right is the hot screw terminal (480) and is connected to the hot electrical building wire. The neutral screw terminal (460) on the left is connected to the neutral electrical building wire. A ground wire is connected to the ground screw terminal (470) on the bottom left of FIG. 4C. The wiring from the ground terminal (470) is not shown in the figure. An electrical connector from the hot screw terminal (480) is shown as a dark trace that connects to the hot blade receptacle (490) in the NEMA connectors and to hot port A (450-1) and hot port B (450-2) in the connectors (430-1, 430-2). The electrical connections from the neutral screw terminal (460) are shown as lighter trace that is connected to the neutral blade receptacle (495) on the left and the neutral port A (440-1) and neutral port B (440-2). When the active cover plate (100, FIG. 4A) is connected over the modified outlet body (400), the active cover plate connector (420, FIG. 4A) will interface with one of connector A (430-1) or connector B (430-2). This will make a connection between the active cover plate (100, FIG. 4A) and the hot (450) and neutral (440) screw terminals that are connected to the electrical wiring. FIG. 4D shows a front view of the active cover plate (100) connected over the decora outlet body (400). The active cover plate (100) covers the both connector A (430-1, FIG. 4C) and connector B (430-2, FIG. 4C).

FIGS. 5A and 5B are diagrams of a "decora" style active cover plate (100) and a "decora" style modified switch (510). In this case, the press button rocker is the "human interface element." The decora style active cover plate (100) can be similar or identical to the active cover plate shown in FIG. 4A and includes a cover plate connector (420). This decora style active cover plate (100) can be used with a decora style modified switch (510), a modified decora outlet body (400), and other decora style devices such as arc-fault outlets and GFCI outlets. Light switches or any other devices that usually do not have an electrical path of return (i.e. connection to a "neutral" wire) may have an additional terminal for connection to the neutral building wire or other path of return. For example, light switches may not have a neutral return screw terminal on the light switch body.

In this example, the decora style active cover plate (100) in FIG. 5A will be connected over a decora style switch body (510) in FIG. 5B. The decora switch body (510) includes 2-port connectors A and B (530-1, 530-2) in the same location as the decora outlet body (400) shown in FIG. 4B. Consequently, the same decora style active cover plate (100) can be used for both types of modified electrical devices (400, FIG. 4B; 510). Although the ports (530) in FIG. 5B are shown in the upper left hand corner and lower right hand corner, the ports (530) could be located at any convenient location on the modified electrical device (510) For example, the upper port could be on the right and the lower port could be on the left.

FIGS. 5C and 5D show an alternative embodiment. In this example, the active cover plate (100) includes two cover plate connectors (420-1, 420-2) and the switch body (510) includes only one connector (530). The cover plate (100) can still be connected upside down or right side up to the switch body. For example, when the cover plate (100) is connected right side up with the switch body, the first cover plate connector (420-1) will connect with the switch body connector (530). When the active cover plate (100) is connected to the switch body upside down, the second cover plate connector (420-2) will connect to the switch body connector (530). The principle of using two connectors on an active cover plate and only one connector on the receptacle body can be generally applied. For example, in the description below, a variety of different cover plates and modified electrical devices are described. The modified electrical devices generally include two separate connectors and the active cover plates include only one connector. However, this arrangement could be reversed as shown in FIGS. 5C and 5D so that the active cover plates include two connectors and the modified electrical devices include only one connector.

Figure 6B:
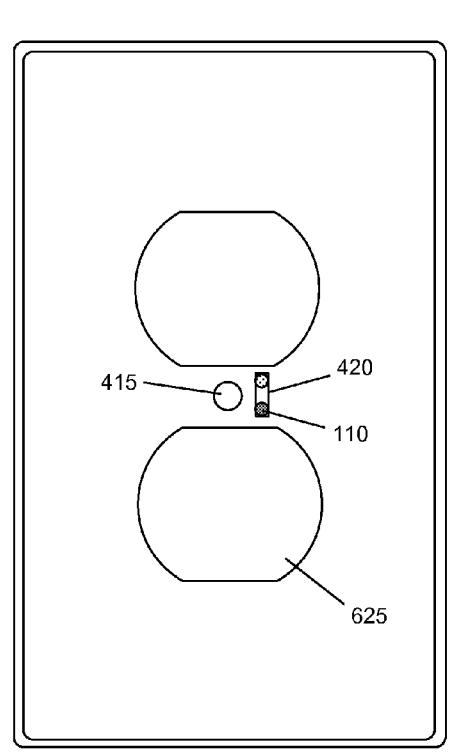

FIGS. 6A and 6B show a modified electrical device (160) with its corresponding active cover plate (100). In this example the modified electrical device (160) is a modified duplex outlet body and the active cover plate (100) is a duplex style active cover plate. The modified duplex outlet body (160) includes two 2-port connectors (430): connector A (430-1) and connector B (430-2). These two 2-port connectors (430) are located on either side of a threaded hole (610) in the center portion of the outlet body (160). In this example, the corresponding active cover plate (100) has only one 2-port connector (420) with prongs (110). The 2-port connector (420) is offset from a through hole (415). The active cover plate (100) also includes two apertures (625) to receive the two corresponding NEMA style receptacles of the outlet body (160). As discussed above, the cover plate connector (420) can connect to either one of the outlet connectors (430) depending on the relative orientation between the outlet body (160) and the active cover plate (100).

The configuration shown in FIGS. 6A and 6B may have a number of advantages, including forming a more secure electrical connection between the active cover plate (100) and the outlet body (160) due to the proximity between the 2-port connectors (430) and the screw passing through the through hole (415) in the active cover plate (100) into the threaded hole (610) in the outlet body (160).

Figure 6C:
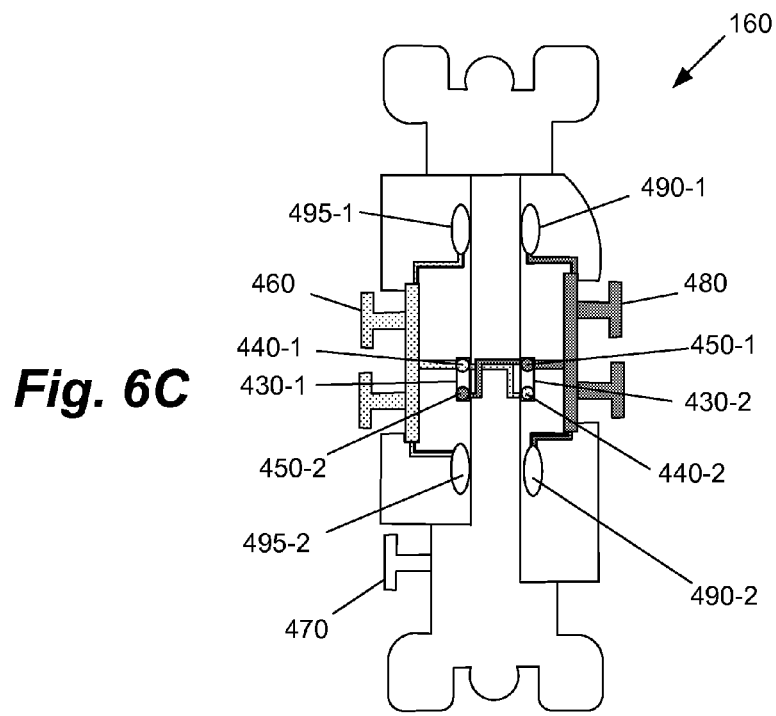
FIG. 6C shows internal wiring in a modified duplex outlet, according to one example of principles described herein.

FIG. 6C is a diagram showing one example of electrical wiring inside the modified electrical device (160) shown in FIG. 6A. The modified outlet body (160) includes a number of screw terminals: a hot screw terminal (480), a ground screw (470) terminal and a neutral screw terminal (460). As discussed above, the appropriate wires from the building wiring are connected to the screw terminals. The hot terminal (480) is electrically connected to the two hot NEMA blade receptacles (490) and to one of the two hot female ports (450) in each of connector A (430-1) and connector B (430-2). The neutral screw terminal (460) is connected to the two neutral NEMA blade receptacles (495) and to the two neutral female ports (440) in connector A (430-1) and connector B (430-2).

The two hot ports (450) are kitty corner from each other rather than straight across from each other. The hot port (450) is in the lower position in connector A (430-1) and in the upper position in connector B (430-2). The neutral port (440) is in the upper position in connector A (430-1) and in the lower position in connector B (430-2). This allows for the same male prong (110, FIG. 6B) on the active cover plate (100, FIG. 6B) to interface with a hot port (450) regardless of whether the active cover plate (100, FIG. 6B) is put on right side up or upside down.

Figure 7:
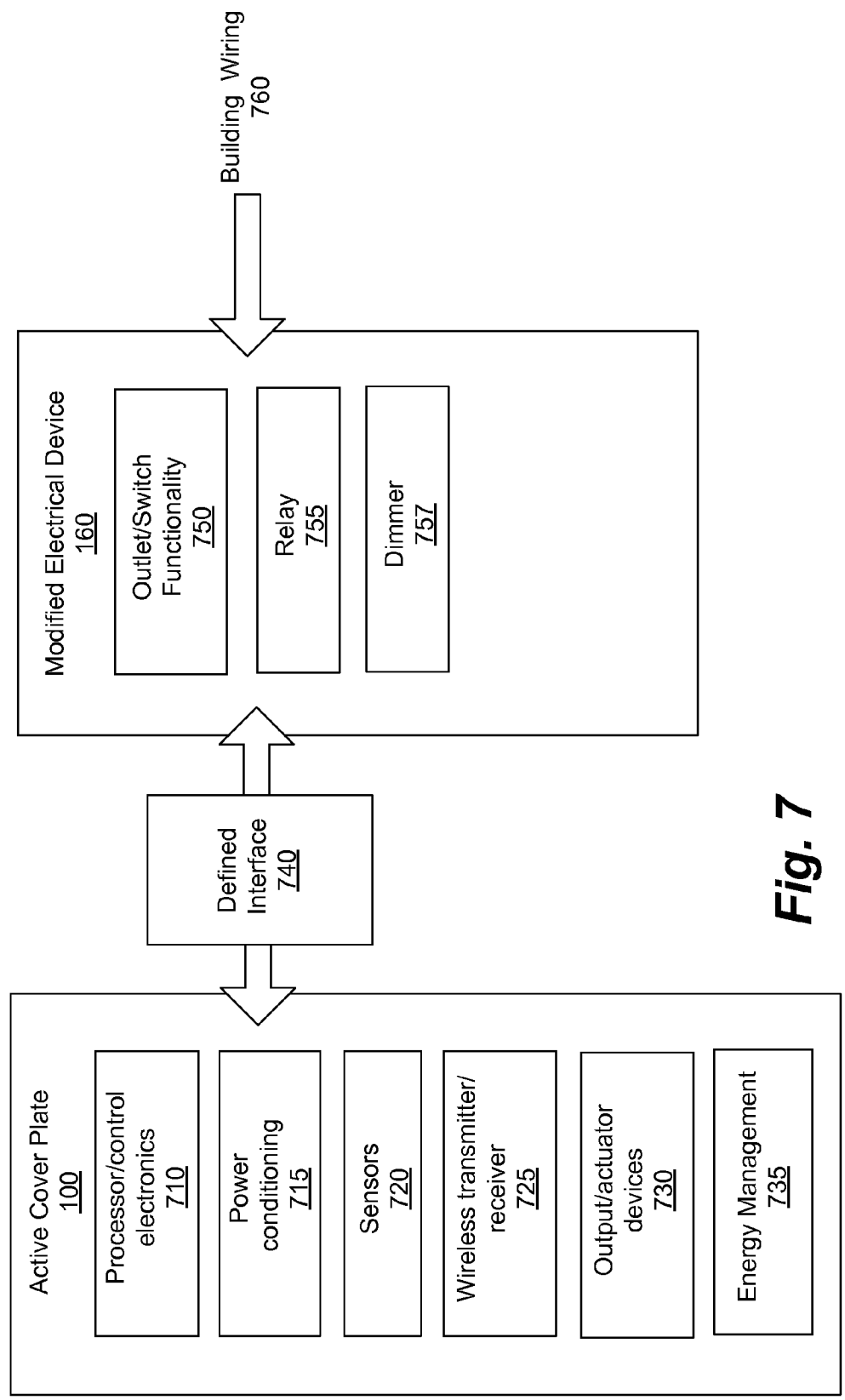
FIG. 7 is a block diagram of various distributions of functionality between an active cover plate and a modified electrical device that are connected by a defined interface according to one example of principles described herein.

FIG. 7 is a block diagram of an electrical system that includes an active cover plate (100) and a modified electrical device (160). The active cover plate (100) interfaces with the modified electrical device (160) through a defined interface (740). The defined interface (740) includes power supplied to the active cover plate (100) and may include signal or data communication between the active cover plate (100) and the modified electrical device (160). In general, the interface may include a mechanical connection and one or more electrical connections. For example, the mechanical/electrical connectors could be a multiport male/female connection. Additionally or alternatively, the mechanical connection may be made through a fastener (such as a screw threading into an outlet body), magnets, or through other means. The electrical connection may be wired or wireless. For example, in the embodiments illustrated above, the electrical connections are wired and are made using a plurality of male pins that are grouped to interface with corresponding female ports in the outlet body.

The system may include a number of modules or functionalities that can be distributed between the modified electrical device (160) and the active cover plate (100). The modules shown in the figures are only illustrative. The illustrated modules could be reordered, replaced, eliminated, or new modules could be added. Further, the distribution of the modules between the active cover plate (100) and the modified electrical outlet (160) could be changed. In this example, the active cover plate (100) includes processor/control electronics (710), power conditioning (715), sensors (720), a wireless transmitter/receiver (725), and output/actuator devices (730). The active cover plate (100) may also include an energy management system (735) that may measure and/or act to conserve energy within the active cover plate (100) and/or the modified electrical device (160). In this example, the modified electrical device (160) includes only its own functionality (outlet/switch functionality) (750) and a relay (755) and/or dimmer (757). The relay (755) selectively breaks the electrical connection to the NEMA receptacles. The relay (755) may be controlled in a variety of ways, including through the use of control signals received from the active cover plate (100) through the defined interface (740). In some examples, the relay (755) may be used to turn on and off devices that are connected to the NEMA receptacles.

One example of a system that may be configured as shown in FIG. 7 is an active cover plate (100) with a carbon monoxide detector. A fan may be plugged into the NEMA receptacle. The active cover plate (100) receives power from the modified electrical device (160) through the defined interface (740) and conditions the power for its own use. When the active cover plate (100) detects carbon monoxide, it analyzes the amount of the carbon monoxide. If the carbon monoxide exceeds a predetermined level or threshold, the active cover plate (100) sends a control signal through the interface (740) to the relay (755). The relay (755) closes, thereby allowing electrical current to flow through the NEMA receptacle to the fan. The fan removes the carbon monoxide from the area. In some circumstances, the active cover plate (100) may also wirelessly transmit data reporting the buildup of carbon monoxide to a base station, home automation system, internet or other device. The active cover plate (100) may also control output/actuator devices (730). For example, the active cover plate (100) may illuminate a light or sound an alarm indicating the presence of carbon monoxide.

Thus in FIG. 7, most of the circuitry and functionality resides in the active cover plate (100). This may have a number of advantages. The active cover plate (100) can be very easy to replace. This can allow for very easy updating and modification of the system. If a cover plate with a new sensor (720) or communication module is available and desired, the old active cover plate (100) can be removed and the new active cover plate (100) installed by simply removing/refastening one or two screws. Thus a home security system can be converted from a ZIGBEE based system to a Wi-Fi based system in a matter of minutes by simply replacing the ZIGBEE cover plates with new cover plates containing Wi-Fi transmitter/receivers. In general, FIG. 7 shows an embodiment where the active cover plate (100) can also control the functionality of the modified electrical device (160). The sensors (720) in the active cover plate (100) could sense light, sound, motion or accept control signals to switch the relay (755) in the modified electrical device (160) ON or OFF according to the sensed conditions/commands.

Alternatively, more of the functionality may be contained in the modified electrical device (160). For example, the active cover plate (100) may contain only two modules/functionalities: sensors (720) and output/actuator devices (730). The active cover plate (100) receives its power and control from the modified electrical device (160) through the defined interface (740). The modified electrical device (160) may include its own outlet/switch functionality (750) and also power conditioning (715) functionality. The power conditioning circuitry (715) delivers electrical power with the desired characteristics to the active cover plate (100) through the defined interface (740). For example, the active cover plate (100) may require 12V DC. The power conditioning circuitry (715) converts 120 V DC (or other power) to the required 12 volts DC. The modified electrical device (160) may also include communication circuitry. For example, the modified electrical device (160) may communicate with other modified electrical devices (160) using the building power (760). The modified electrical device (160) may also include processor/control electronics (710) for analyzing data and making control decisions. As discussed above, the modified electrical device (160) may also include a relay (755), dimmer (757) or other high voltage circuitry to control a flow of electrical current through the device.

In some examples, the modified electrical device may be constructed so that a standard cover plate can fit over it. The standard cover plate has no electrical load or functionality. It simply fits onto the modified electrical device and covers openings to the electrical box. If a user later wants to add functionality to their electrical system, they can simply replace the standard cover plate with an active cover plate containing the desired functionality. The active cover plate then interfaces electrically with the modified electrical device to provide the desired functionality. Thus, in one embodiment, the modified electrical device is configured to accept both standard (non-active) cover plates and active cover plates. Further, the active cover plate may or may not interface with the connectors on the face of the receptacle body. For example, the active cover plate may include a number of prongs that contact screw terminals on the sides of the receptacle body.

As discussed above, there may be a variety of active cover plates that could be used in conjunction with the modified electrical device and these active cover plates could be readily swapped out to provide the desired functionality. For example, when a new sensing or communication technology becomes available, an old active cover plate can be swapped out with a new active cover plate that contains the new sensing or communication technology. This allows for the same modified electrical device to remain in place, together with any power, communication, and sensing technology that it contains. For example, a modified electrical device may include a relay that is controlled by a control signal received from an active cover plate. Originally, the active cover plate that communicates using ZIG-BEE technology may be used for short range wireless monitoring and control. The owner then decides that a longer distance technology would be desirable and selects a Z-WAVE active cover plate to replace the ZIG-BEE active cover plate. By simply replacing the cover plate and without any need to purchase or replace the modified electrical device, the system can be converted from ZIG-BEE to Z-WAVE technologies.

Thus, separating the functionality of the electrical system between an active cover plate and a modified electrical device can provide significant flexibility and cost savings in upgrading the electrical system. Swapping active cover plates can be accomplished by removing one or two screws that hold the active cover plate in place, pulling the active cover plate away from the modified electrical device to break electrical contact with the modified electrical device and replacing it with a different active cover plate. For example, the modified electrical device may contain high voltage components such as relays, dimmers, fuses, breakers, and power conditioning circuitry. In this case the term "high voltage" refers to the voltage delivered by the building wiring to the modified electrical device. The active cover plate paired with the modified electrical device may contain low voltage circuitry such as wireless communication modules, sensors and control circuitry. This separation of functionality between an active cover plate and a modified electrical device may also provide a number of safety and manufacturing benefits. Because the high voltage circuitry is encased in the modified electrical device, there is minimal risk of shock or arcing in the active cover plate or at the interface between the modified electrical device and the active cover plate. This reduces safety risks associated with the active cover plate. Additionally, when an active cover plate only contains low voltage components there can be more latitude in the design of the active cover plate and can reduce the overall cost of producing the active cover plate.

The examples given above show various distributions of functionality and components throughout the system. A variety of other elements/functionalities could be included and various other distribution arrangements could be used.

Figure 8:
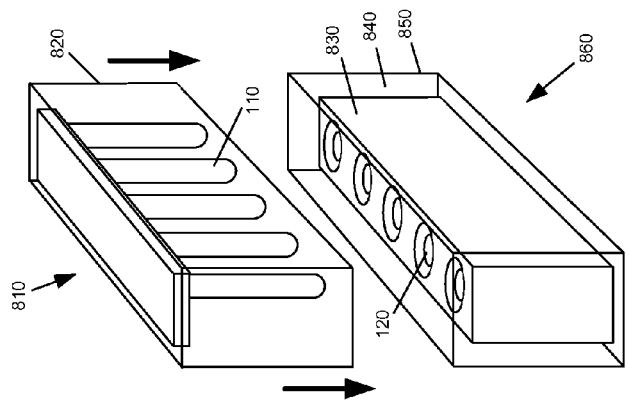
FIG. 8 is a perspective view of a multiport connector, according to one example of principles described herein.

The incorporation of control and signal lines between the modified electrical device (160, FIG. 1B) and the active cover plate (100, FIG. 1A) may require additional conductive paths in the interface. FIG. 8 shows one example of a connector that includes multiple male prongs (110) and mating female ports (120). In this example, the male prongs (110) are arranged in a linear array. However, they could be arranged in any desired configuration. The male prongs (110) are surrounded by an inner wall (820). In some examples, the inner wall (820) may extend beyond the prongs (110) to protect them from accidental damage. The male prongs (110) and inner wall (820) are connected to the active cover plate (100, FIG. 1A).

The outlet/switch connector (860) is designed to mate with the cover plate connector (810). The outlet/switch connector (860) includes a block (830) with a number of female ports (120) disposed in the block (830). The block (830) is surrounded by a trench (840) between the block (830) and an outer wall (850) that is sized to receive the inner wall (820) of the cover plate connector (810). When the two connectors are brought together, the inner wall (820) fits into the trench (840) and the male prongs (110) make electrical connections with the female ports (120). In this example, there are five electrical connections made when the connectors are mated. However, there may be any number of other electrical connections. For example, there may be one, two, three, four, five or more electrical connections formed in the interface.

Figure 9B:
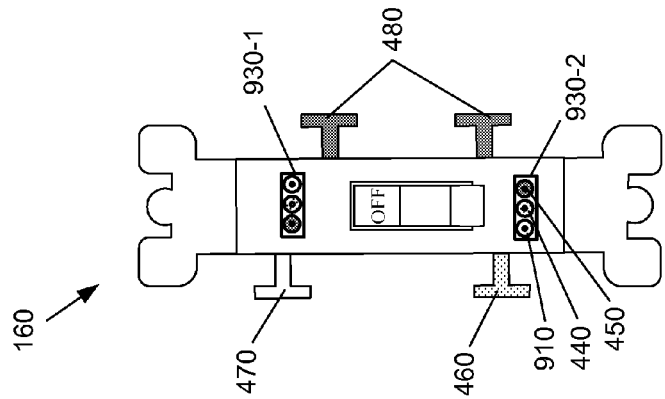
FIGS. 9A and 9B show an electrical system that includes an active cover plate and modified toggle switch, according to one example of principles described herein.
Figure 9A:
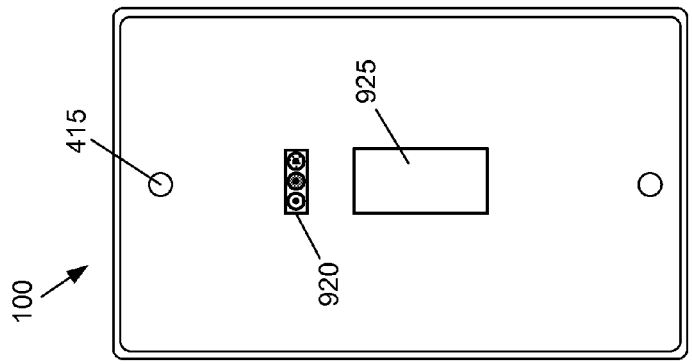

FIG. 9A shows one example of an active cover plate (100) that includes a three prong/port connector (920). In this example, the active cover plate (100) is for covering a toggle switch. The active cover plate (100) includes: an aperture (925) for the toggle switch to extend through, two through holes (415) to receive screws to secure the cover plate to the switch body, and a three pronged connector (920).

In the example shown in FIG. 9B, the modified electrical device (160) is a switch body that includes two connectors (930), each with three female ports (910, 440, 450). One connector (930-1) is located above the toggle switch and one connector (930-2) is located below the toggle switch. The switch body includes multiple screw terminals, including two separate hot terminals (480), a neutral terminal (460), and a ground terminal (470). The switch body is slightly more complex to interface with than an active cover plate (100, FIG. 9a) because the switch has two states: "ON" and "OFF". In the ON configuration electrical current can flow between the two hot terminals (480). In the OFF configuration, the circuit is broken and there is no electrical path through the switch. To overcome this, three power connections are made between the cover plate and the switch body: ground (910), neutral (440), and hot (450). These three power ports allow the active cover plate (100) to receive electrical power regardless of the state of the switch and without "back-feeding" through the light when the light switch is in the OFF position. The ground port (910) may or may not be used. Typically, the return path of the electricity is through the neutral port (440).

Figure 10A:
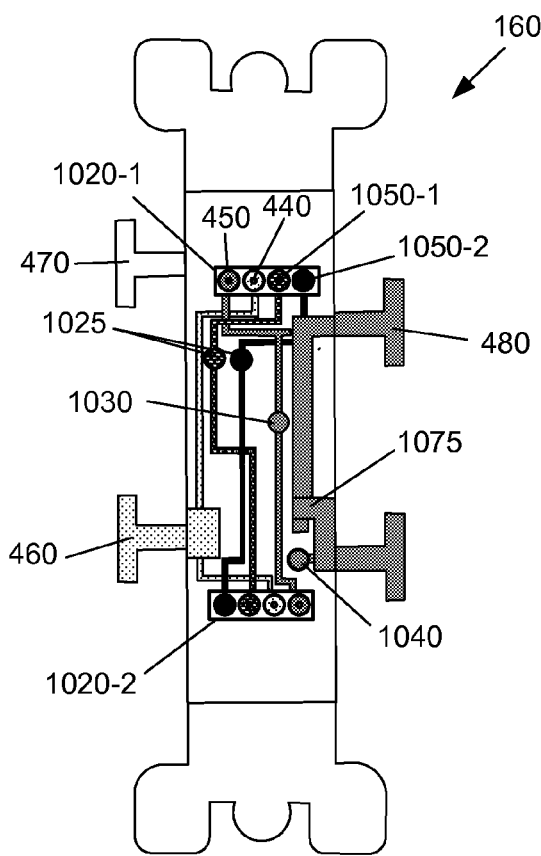
FIGS. 10A and 10B show wiring diagrams of the modified toggle switch, according to one example of principles described herein.

FIG. 10A is a wiring diagram of an illustrative modified electrical device (160). In this example, the modified electrical device (160) is a switch body that includes 4-port connectors (1020). As discussed above, the modified switch body includes a ground terminal (470), hot screw terminals (480), and a neutral screw terminal (460). The two 4-port connectors (1020) are located above and below the toggle switch. Each of the connectors (1020) includes a hot port (450), neutral port (440), a first control line port ("C1") (1050-1) and a second control line port ("C2") (1050-2). The appropriate connections are made between the various screw terminals and the ports to connect the neutral screw terminal (460) and hot screw terminal (480) to the designated ports. The switch body also includes an internal relay (1075). The relay (1075) controls connectivity between the two hot terminals (480). The relay (1075) is controlled by control lines/ports "C1" (1050-1) and "C2" (1050-2). The relay (1075) can cut power to a connected device by creating an open circuit. This bypasses the manual switch remotely. Also shown are control junction points (1025) and hot points (1030, 1040).

Figure 10B:
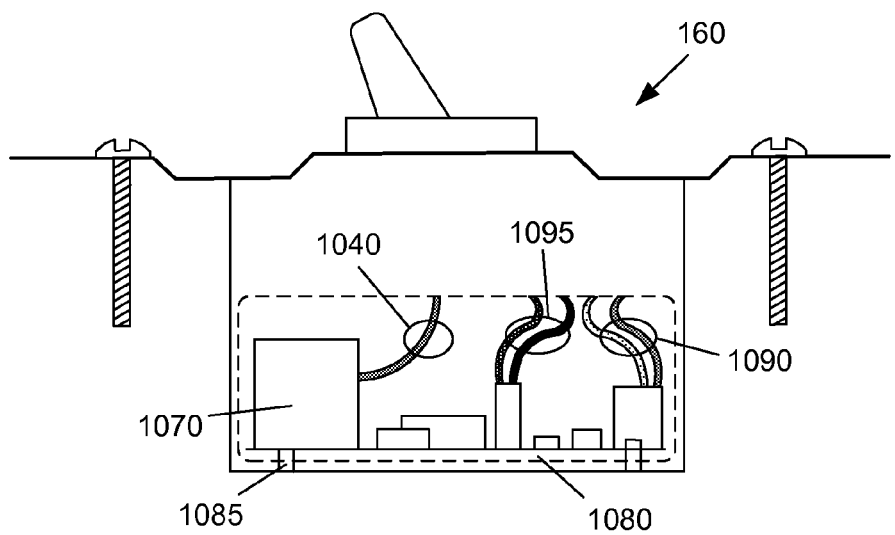

FIG. 10B shows a partially cut away side view of the modified electrical device (160) shown in FIG. 10A, which is a switch body. The switch body includes a printed circuit board (PCB) (1080) mounted by standoffs (1085) extending from the housing of the switch body. On the PCB (1080) there is a relay (1070) and various power conditioning/control circuits. In this example, a "hot" return line (1040) is connected to the relay (1070) and low voltage signal connections (1095) from the control junction points (1025) are connected to the PCB (1080) to control the action of the relay (1070). The PCB (1080) also receives power inputs through power lines (1090) that conditions power on the circuit board and supplies the power to the appropriate ports at the interface/connectors.

Figure 11A:
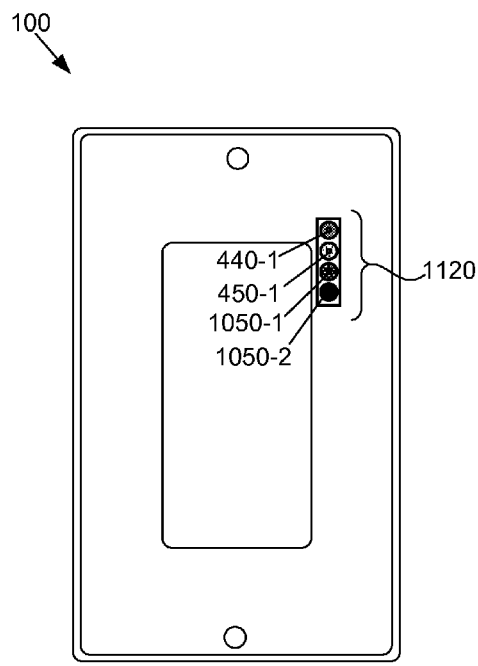
FIGS. 11A and 11B are diagrams of multiport connectors and electrical wiring of a modified decora outlet and a mating active cover plate, according to one example of principles described herein.
Figure 11B:
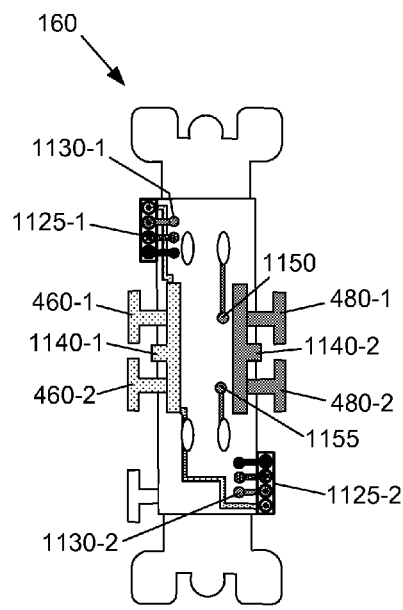

FIGS. 11A and 11B show a decora style system with multiport connectors. In this example, the active cover plate (100) has a 4-port connector (1120) located in the upper right side of the plate. This 4-port connectors (1120) include a hot prong (440-1), neutral prong (450-1), and two control ports (1050-1, 1050-2). The modified electrical device (160) in this example is a decora outlet body that includes two 4-port connectors (1125-1, 1125-2), one located on the upper left of the body and one located on the lower right of the body.

In FIG. 11B, a cutaway top view of the electrical connections between the various ports and terminals are shown. Two "hot" connections (1130-1, 1130-2) bring power into an internal relay (1070, FIG. 11C) in the outlet body. There are two return lines from the internal relay (shown below in FIG. 11C), one for the top outlet (1150) and one for bottom outlet (1155). These two return lines are controlled by the internal relay and only deliver electricity to the outlet receptacles when the internal relay is closed.

In general, the term "multiport connector" refers to connectors that include, in addition to power ports, communication or control ports. A multiport connector may include a hot port, a neutral or ground port, and one or more communication/control ports. The control ports allow communication back and forth between the modified electrical device and the active cover plate. This communication may include, for example, power consumption data sensed by the modified electrical device or a room temperature detected by the active cover plate. In one implantation, a heater is being run in a room. The cover plate may sense a buildup of heat in the room and instruct the modified outlet to turn off power to the heater.

In another example, if the active cover plate detects that a room is not being used, the modified electrical device could be instructed to turn off the lights. Additionally, the active cover plate and/or the modified electrical device could be in communication with a network or wireless device that could be used to receive signals/sensor data from system. Additionally, the external device could send signals controlling the function of the modified electrical device and active cover plate.

Figure 11C:
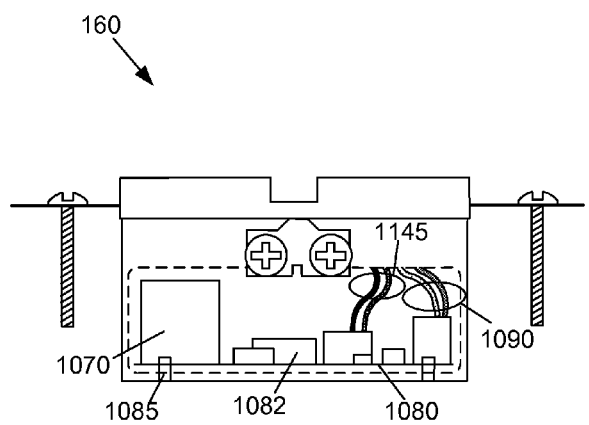
FIG. 11C is a side view of a modified duplex outlet showing wiring between various components, according to one example of principles described herein.

FIG. 11C is similar to FIG. 10B and shows a partially cutaway side view of the outlet (in this case a decora outlet body). Power lines (1090) to the PCB (1080) are brought from the upper portions of the decora outlet body. The PCB (1080) is mounted to a housing of the outlet by standoffs (1085) extending from the housing of the outlet body, with wireless components (1082) and a relay (1070) mounted to the PCB (1080). The control port lines (1145) make control connections between the active cover plate (100, FIG. 11A) and the decora outlet body. The control port lines (1145) may be used to control elements on the active cover plate (100, FIG. 11A) or elements within the outlet body. The control port lines (1145) may also be used to transfer data between the active cover plate (100, FIG. 11A) and the decora outlet body.

In many outlets, there are break off tabs (1140-1, 1140-2, FIG. 11B) between the two neutral screw terminals (460-1, 460-2) and the two hot screw terminals (480-1, 480-2). The break off tabs (1140) can be removed to electrically separate the two neutral screws and/or the two hot screw terminals. In this case one of the hot screw terminals is labeled "common" and will always be powered when the outlet is correctly installed. By connecting the port wiring to the common hot/neutral screw terminal, the ports will receive power regardless of whether the breakout tab is removed or not.

Figure 12A:
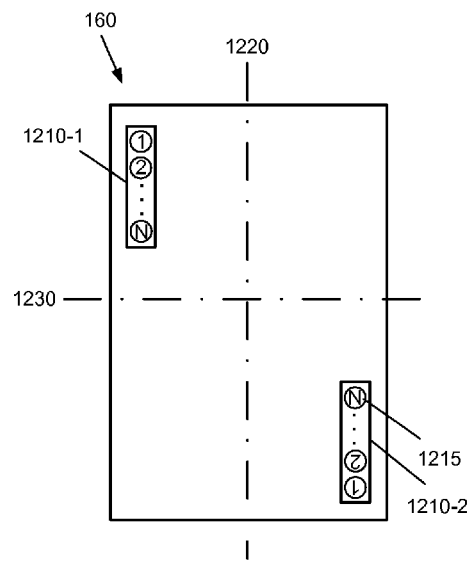
FIGS. 12A-12D are various diagrams of principles for laying out/describing connector patterns on the face of a modified electrical device, according to one example of principles described herein.

FIGS. 12A-12D are simplified diagrams of illustrative patterns and configurations for connectors on the face of the modified electrical device (160). FIG. 12A shows a modified electrical device (160) that includes two device connectors; connector A (1210-1) and connector B (1210-2), each with N ports (1215). The modified electrical device (160) could be based on any of a number of electrical outlets, switches, or terminals. The two device connectors (1210) could be any of a number of connector types, including surface contacts, male prongs, female ports, or other appropriate connectors. The device connectors (1210) may have any number of ports/prongs/contacts that are arranged in any of a number of geometries. In the example shown in FIG. 12A, the device connector A (1210-1) includes port 1, port 2 . . . to port N, where N can be zero or any positive integer. For example, the device connector A (1210-1) may include 2, 3, 4, 5, 6 or more ports, prongs, or contacts. In some embodiments, the device connector B (1210-2) is identical to the device connector A (1210-1) except that it is oriented on the face of the modified electrical device (160) in a different way. In general, the term "face" refers to any exposed surface of the modified electrical device (160) that is presented for connection when the modified electrical device (160) is installed in an electrical box. The orientation of the connectors allows a modified electrical device to be mounted upside down or right side up and active cover plate (100, FIG. 1A) to be connected in either a right side up or upside down configuration while maintaining the same polarity on the electrical connections in the active cover plate (100, FIG. 1A). The term "same polarity" means that a voltage with the same positive sense is consistently applied to the same electrical conductor in the active cover plate, irrespective of the relative orientation of the active cover plate with respect to the receptacle body. Similarly the term "same polarity" means that a voltage with the same negative sense is consistently applied to a particular electrical conductor in the active cover plate, irrespective of the relative orientation of the active cover plate with respect to the receptacle body. If alternating current is supplied from the receptacle body to the active cover plate, the term "same polarity" means that the "hot" terminal and the "neutral" terminal on the receptacle body are each connected to a particular conductor in the active cover plate regardless of the relative orientation of the active cover plate with respect to the receptacle body.

The arrangement of the connectors can be described in a variety of ways. For example, the orientation of connector B (1210-2) with respect to connector A (1210-1) may be mirrored about a vertical axis (1220) and mirrored about a horizontal axis (1230). This results in connector B (1210-2) being upside down on an opposite side of the face of the modified electrical device (160).

Figure 12B:
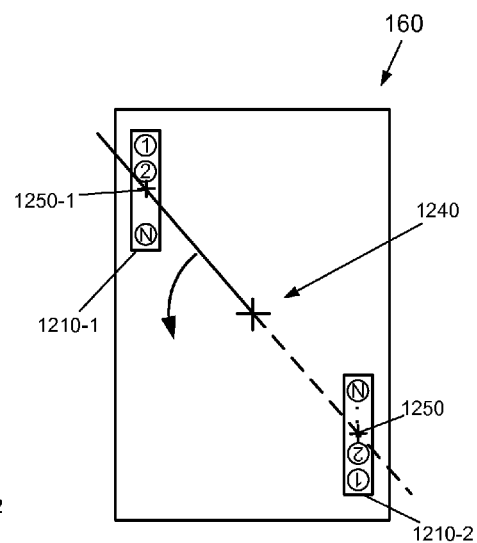

FIG. 12B shows another way of describing the orientation of the connectors A (1210-1) and B (1210-2) on the face of the modified electrical device (160). Connector B (1210-2) is an axially rotated version of connector A (1210-1). This can be shown by defining a geometric center (1240) of the face of the modified electrical device (160) and drawing a line between the geometric center of the device (1240) and a geometric center of connector A (1250-1). To obtain the orientation of connector B (1210-2), the line is rotated 180 degrees about the geometric center (1240) of the modified electrical device (160). This achieves the identical results as shown in FIG. 12A. Specifically, connector B (1210-2) is upside down and on an opposite side of the face of the modified electrical device (160) from connector A (1210-1). A straight line passes through the geometric center (1240) of the connector A (1250-1), the geometric center (1240) of the modified electrical device (1240), and the geometric center of connector B (1250-2).

Figure 12C:
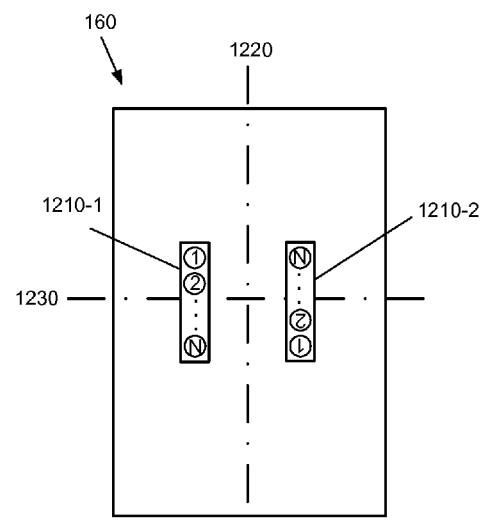
Figure 12D:
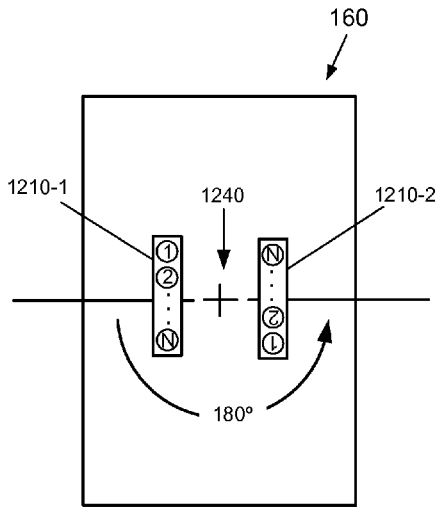

FIG. 12C shows different positions of connectors A and B (1210) on the face of the modified electrical device (160) that follows the same rules as FIG. 12A. Specifically, connector B (1210-2) is a vertically and horizontally mirrored version of connector A (1210-1). However, in this case, the connectors are located closer to the center of the modified electrical device (160) than the example shown in FIGS. 12A and 12B. The resulting pattern has a number of distinct characteristics, including connectors that are equally distant from the center and edges of the modified electrical device (160). FIG. 12D shows a different way of describing the orientation of the connectors (1210) on the face of the modified electrical device (160) that is comparable to that used in FIG. 12B. Specifically connector B (1210-2) is an axially rotated 180 degrees about a geometric center (1240) to describe the location of connector A (1210-1).

Connectors (1210) are positioned so that the active cover plate (100, FIG. 1A) hides the connection when installed. The active cover plates (100, FIG. 1A) can leave the original functionality of the electrical device accessible and usable. For example, if the modified electrical device (160) is a duplex or decora outlet, both NEMA receptacles are accessible and ready to be connected to an electrical cord.

Figure 13B:
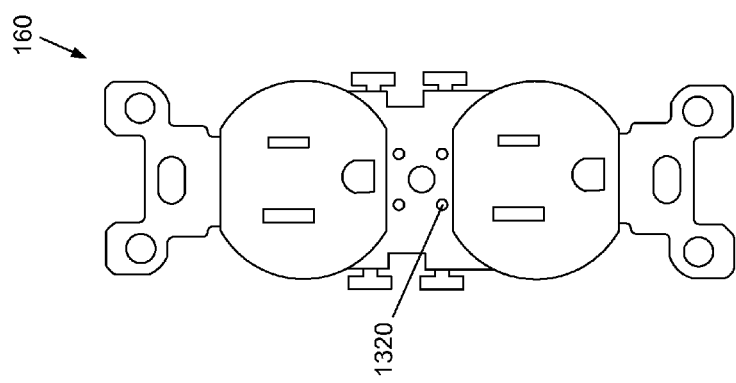
FIGS. 13A and 13B show a cover plate with surface contacts and a mating modified duplex outlet with nub contacts, according to one example of principles described herein.
Figure 13A:
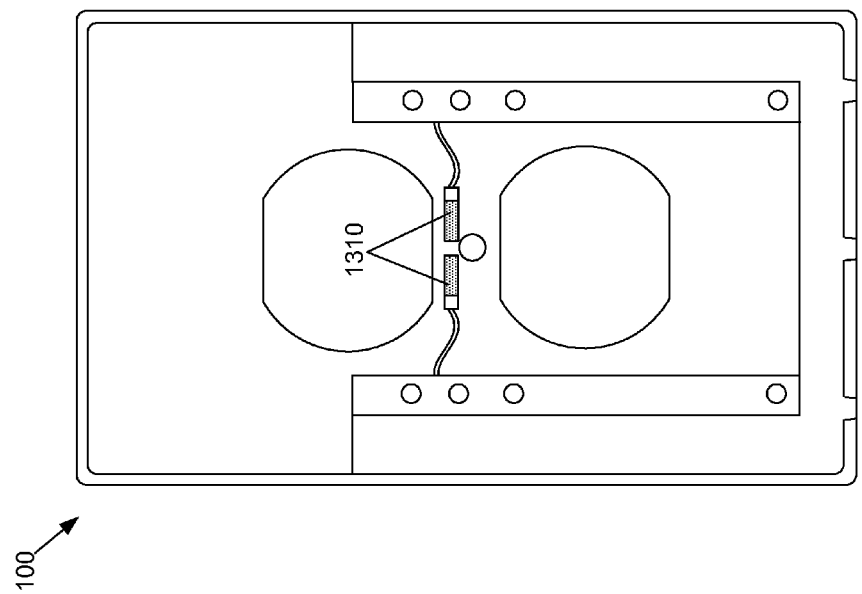

The prong/port interfaces described above are only examples of one type of interface. A variety of other interface types could be used. For example, FIGS. 13A and 13B show a modified electrical device (160) with surface nubs (1320) that supply low voltage power to an active cover plate (100) with matching surface contacts (1310). The nubs (1320) are supplied with low voltage power from internal circuitry in the modified electrical device. For example, the nubs (1320) may be electrified with 1.8 to 6 volts. The nubs (1320) in this example are small exposed bumps of metal. The surface contacts (1310) on the cover plate may be metallic leaf springs that extend away from the surface of the active cover plate (100). When the active cover plate (100) is mounted to the modified electrical device (160), the nubs (1320) depress the surface contacts (1310) to make a secure electrical contact.

Because of the low voltage applied to the nubs, the exposure of the nubs when the cover plate is not in place does not pose a safety risk. Examples of various locations for nubs and their polarities are shown in the figures. However, a number of other configurations could be used. The nubs could have any of a variety of locations and may or may not follow one or more of the symmetrical rules described above. For example the nubs may be distributed over the face of the modified electrical device as shown in FIGS. 12A-12D so that the outlet/cover plate can be mounted either right side up or upside down.

Figure 14A:
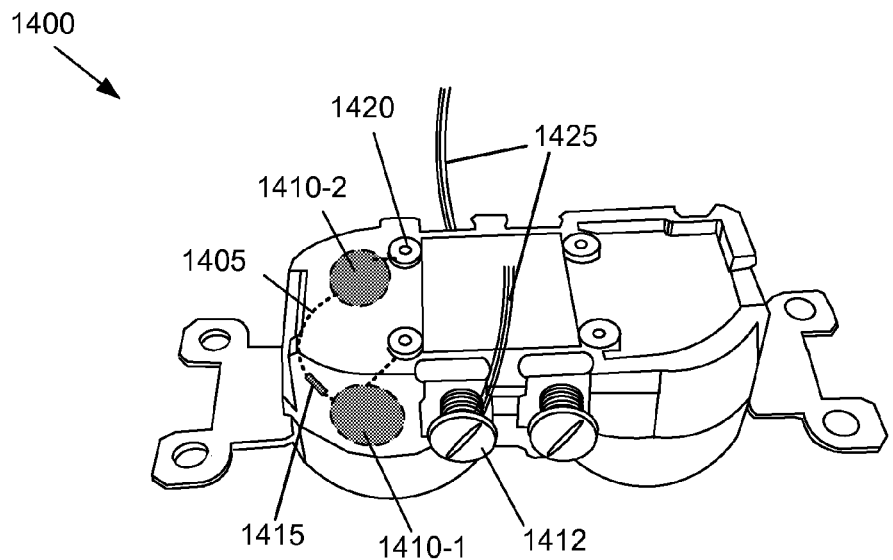
FIGS. 14A and 14B show a modified outlet with internal coils and an active cover plate that receives power from the internal coils, according to one example of principles described herein.
Figure 14B:
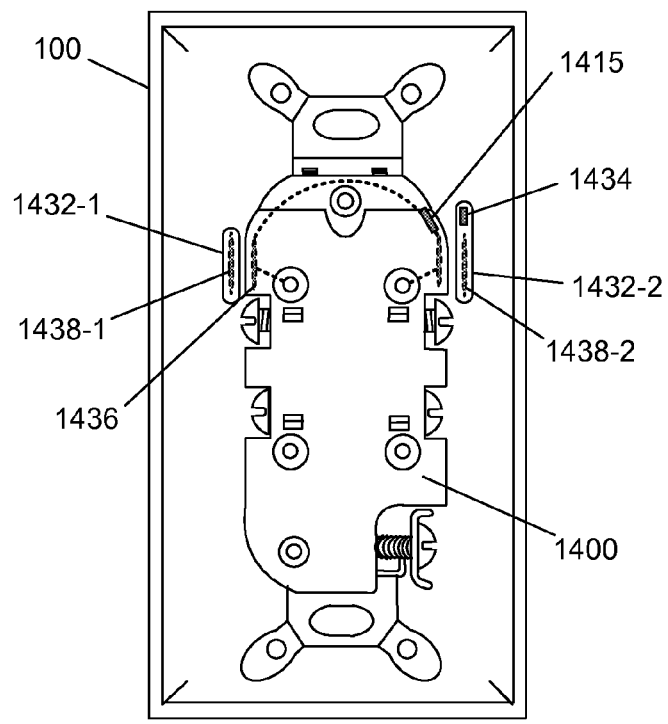

FIGS. 14A and 14B show an electrical outlet (1400) (a "modified electrical device") that includes internal inductive coils (1410). Two power wires (1425) are shown connected to the screw terminals (1412) on either side of the outlet (1400). The internal inductive coils (1410) are located near the perimeter of the outlet (1400). The internal inductive coils (1410) are connected to internal conductors (1405). In this example, the inductive coils (1410) are shown as being electrically connected to the internal conductors (1405) of the stab-in connectors (1420).

In one implementation, a magnetic reed switch (1415) is placed in the line between the coils (1410). A magnetic reed switch (1415) is ordinarily open and no current flows through the internal inductive coils (1410). When a magnet (1434) is placed near the reed switch (1415), the reed switch (1415) closes and allows electrical current to flow.

FIG. 14B shows an active cover plate (100) placed over the modified electrical outlet (1400) that includes internal coils. The active cover plate (100) includes two insulated tabs (1432-1, 1432-2). In this example, both insulated tabs (1432) have embedded low voltage coils (1438-1, 1438-2). The tab (1432-2) nearest the reed switch (1415) also contains a permanent magnet (1434). The permanent magnet (1434) closes the reed switch (1415) inside the outlet (1400) to allow electrical energy to flow through the high voltage coils (1436) in the outlet (1400). Electrical energy can then be inductively coupled out of the high voltage coils (1436) and into the active cover plate (100). Thus, when an active cover plate (100) is not in place over the outlet (1400), there is no energy dissipation in the outlet (1400). When the active cover plate (100) with an embedded magnet (1434) is placed over the outlet (1400), the reed switch (1415) closes and allows the electrical current to flow through the device. In this example, the power extractors comprise the insulating tabs (1432), the low voltage coils (1438) and the permanent magnet (1434).

Figure 15A:
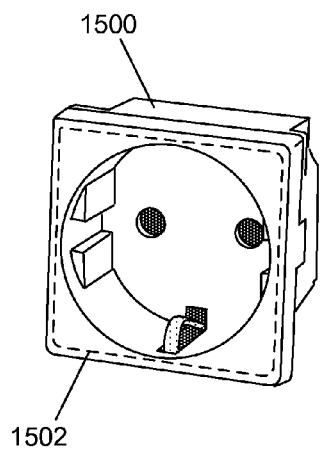
FIGS. 15A-15C show additional examples of coil systems transferring power to active cover plates, according to one example of principles described herein.
Figure 15B:
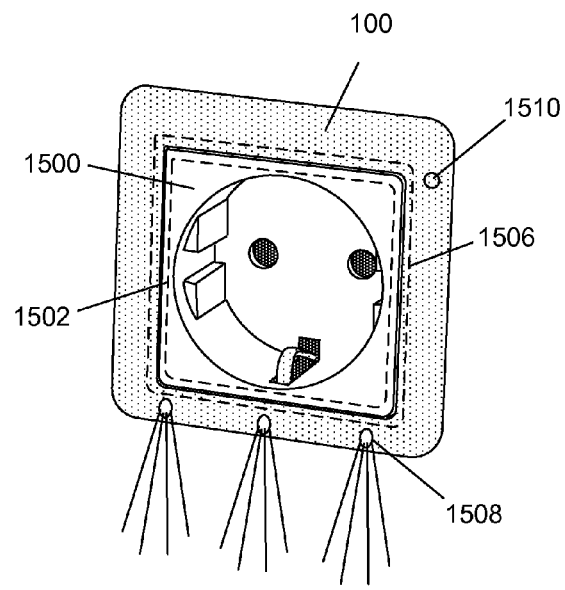
Figure 15C:
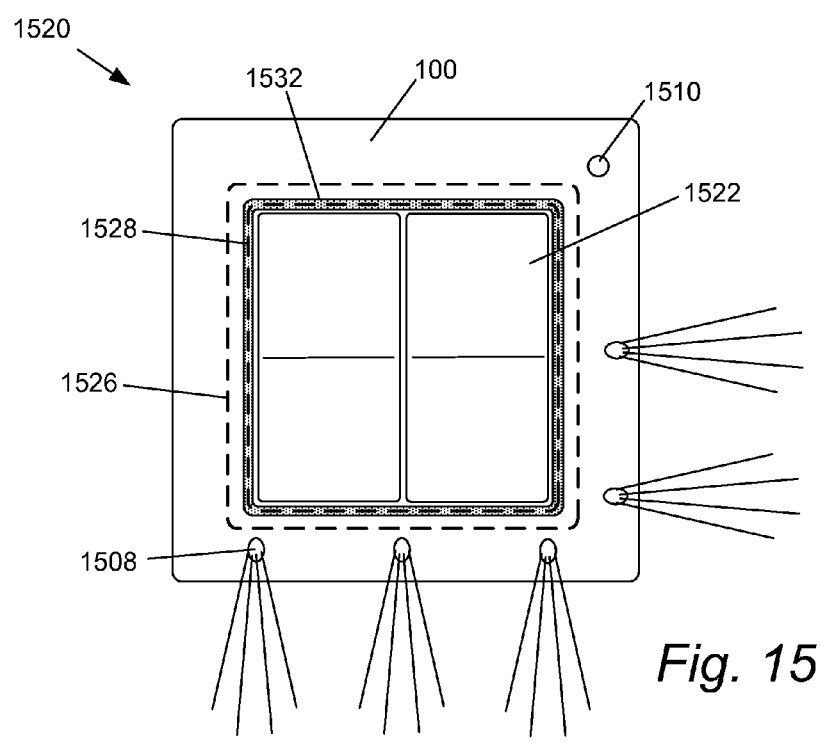

FIGS. 15A-15C show another example of an inductive coupling between an outlet and a cover plate. FIG. 15A shows a modified outlet (1500) configured to accept a Europlug style cord. The modified outlet (1500) includes an internal coil (1502) around its perimeter.

FIG. 15B shows an active cover plate (100) that surrounds the outlet (1500). The active cover plate (100) contains a low voltage coil (1506) that inductively extracts power from the internal coil (1502). This powers any of a number of devices that may be present in the active cover plate (100). In this example, the active cover plate (100) includes a light sensor (1510) and a number of lights (1508). However, the cover plate (100) could include any of a number of components, including those described above. For example the active cover plate (100) could include a smoke detector, speaker, camera, wireless connectivity, carbon monoxide detector, or other device.

FIG. 15C shows a switch assembly (1520) that includes a double gang of switches (1522) and an active cover plate (100). A bezel (1532) runs around the perimeter of the switches and is an integral part of the switch assembly (1520). In this example, a high voltage coil (1528), represented by a dashed line, has been formed inside the bezel (1532). After the switches (1522) have been installed in the outlet box, the active cover plate (100) can be installed around the switches (1522). Around the inner perimeter of the active cover plate (100), a low voltage coil (1526) has been installed to inductively extract power from the high voltage coil (1528). In this example, the active cover plate (100) includes a light sensor (1510) and a number of lights (1508). The lights (1508) may be arranged in any of a variety of locations and point in any direction. In this example, three of the lights are arranged to point downward to illuminate the floor and two of the lights point to the right to illuminate an adjacent doorway.

Inductive coupling of energy out of the outlet may have a number of advantages. Where the high voltage coils are an integral part of the outlet, the active cover plate does not include any high voltage components. This can reduce the design requirements of the active cover plate. Further, simple modifications of the outlet, such as attaching a clip containing high voltage coils to the outlet, allows production outlets to have the desired inductive coupling capabilities.

Figure 16:
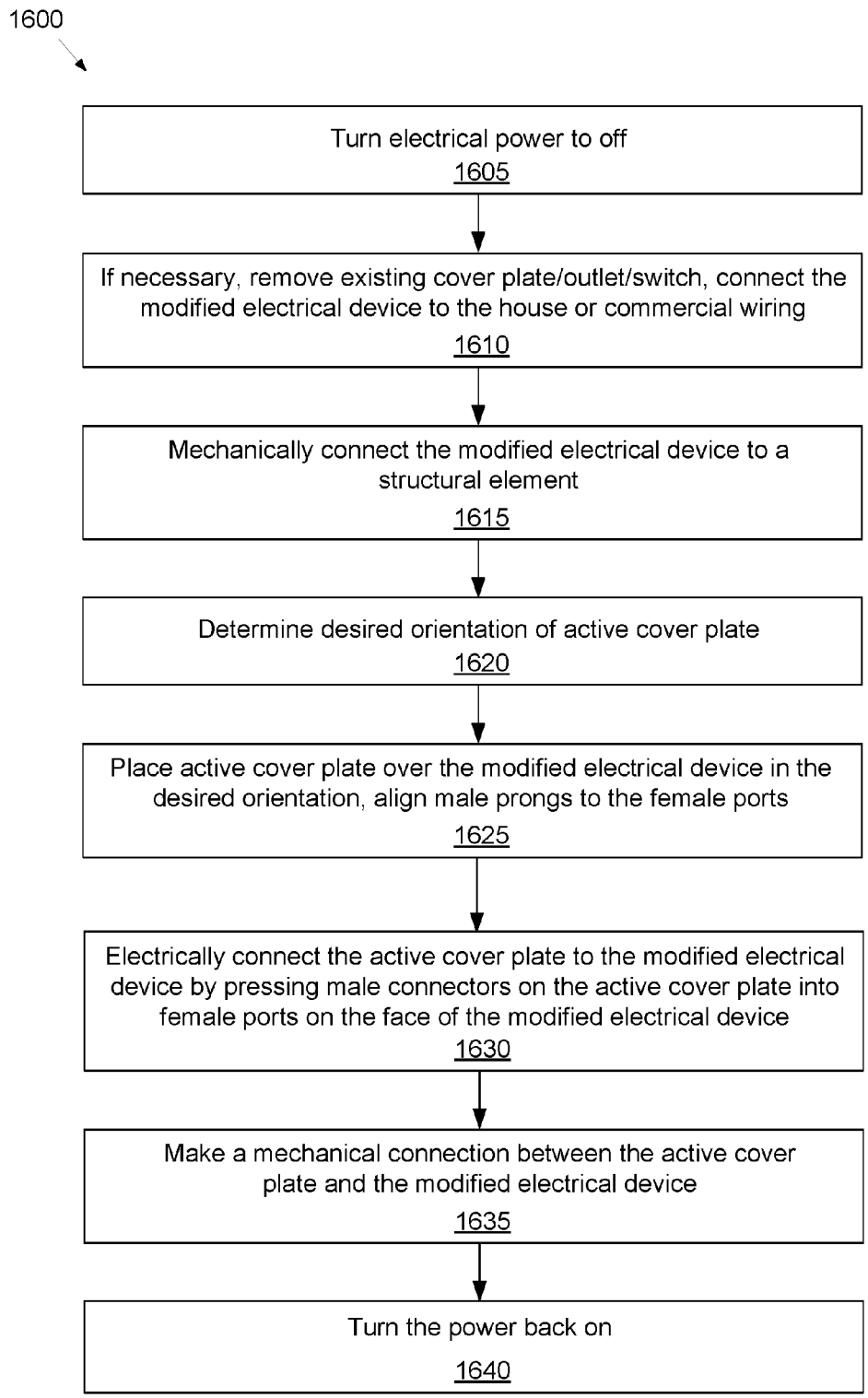
FIG. 16 is a flow chart of a method for installing an electrical system that includes a modified electrical device and a mating active cover plate, according to one example of principles described herein.

FIG. 16 is a flow chart of an illustrative method (1600) for installing an electrical system that includes a modified electrical device and an active cover plate. The electrical power is turned off to the electrical box, room, or area in which the installation will take place (step 1605). This may be done by throwing the appropriate breaker switch into an OFF position or turning the electrical power off to the entire building. If the modified electrical device is to replace an existing outlet/switch, remove the existing cover plate and outlet/switch by removing the fasteners and disconnecting the building wiring. For new construction there are no existing cover plates or outlet/switches and the process can proceed to the next step. Connect the modified electrical device to the building or commercial wiring by making the appropriate connections between the building wiring and electrical terminals on the modified electrical device (step 1610). In most instances, the electrical terminals on the modified electrical device will be in the same position as the electrical terminals in the old device. The terminals may be screw terminals on the sides of the modified electrical device, stab in connectors on the rear of the device, or other connections. The modified electrical device is mechanically connected to the electrical box or other structural element(s) (step 1615). In most instances the orientation (right side up; upside down) of the modified electrical device is not critical. The desired orientation of the active cover plate is determined (step 1620) and the active cover plate is placed over the modified electrical device in the desired orientation and the connectors are aligned (step 1625). If the active cover plate uses prong/port connections, the male connector on the active cover plate is pushed into contact with one of the female connectors on the modified electrical device (step 1630). This creates electrical contact between the prongs of the male connector and ports in the female connector. The other female connector is not used because it does not align with a male connector on the active cover plate. The active cover plate is mechanically secured in place over the modified electrical device (step 1635). The power can then be turned on (step 1640) and the active cover plate and the modified electrical device begin to operate. The modified electrical device retains the original functionality of the outlet/switch, including access to all power receptacles present on the modified outlet. For example, if the modified electrical device replaces a duplex NEMA outlet, both of the NEMA receptacles are accessible and available to power external appliances.

The steps described above are only one illustrative example. The method may be performed in any of a variety of ways. Steps in the method may be reordered, combined, omitted, or new steps may be added. For example, in some examples where the prongs/ports transfer only low voltages or there are no exposed contacts in the design, it may be unnecessary for the power to be turned off/on during the installation process.

Figure 17:
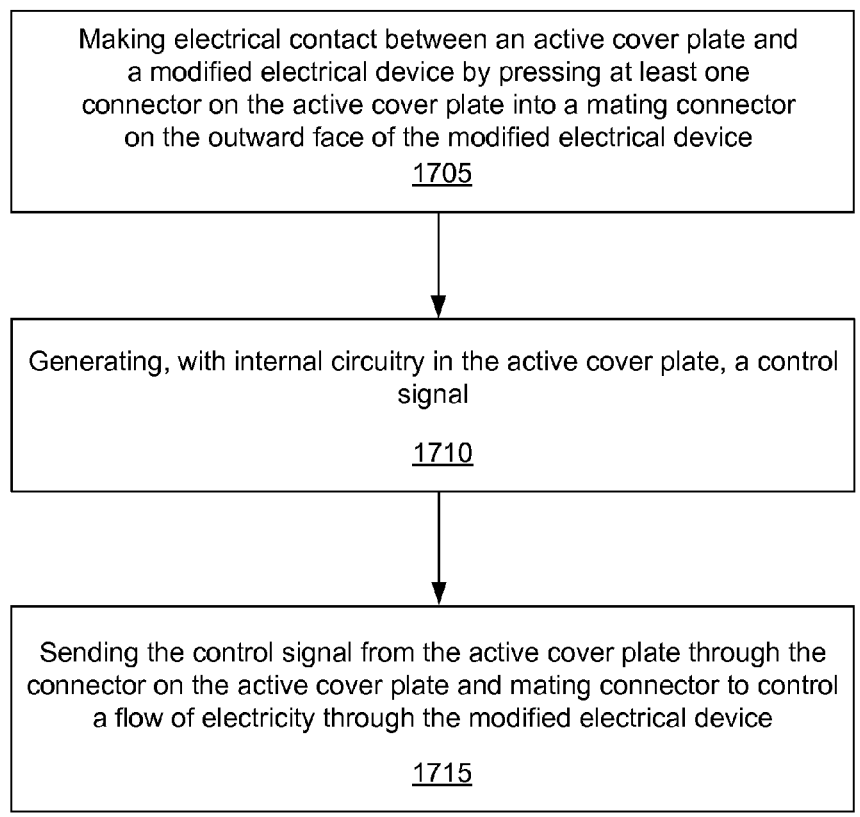
FIG. 17 is a flow chart of a method for controlling the flow of electrical power through a modified electrical device, according to one example of principles described herein.

FIG. 17 is a flow chart of an illustrative method for controlling the flow of electrical power through a modified electrical device. The method may include making electrical contact between an active cover plate and a modified electrical device by pressing a connector on the active cover plate into a mating connector on the outward face of the modified electrical device (block 1705). The internal circuitry in the active cover plate generates a control signal (block 1710). The control signal can then be sent from the active cover plate through the connector on the active cover plate and mating connector to control a flow of electricity through the modified electrical device (block 1715).

In summary, a modified electrical device includes a body and at least one connector on the body to make power and control connections with an active cover plate. The body may be any type of electrical receptacle or energized device that is designed to supply or control power or to supply electrical signals and is also configured to receive an active cover plate. The body may interface with the active cover plate through any of a number of interfaces/connectors. The interface/connector may include any of a variety of different types of connectors capable of transmitting electrical power and/or signals. For example, the connector may include surface contacts, wired connections, pin/prong connections or wireless connections. In one example, the connection is used to send electrical signals over a power connection. For example, the modified electrical device and active cover plate may communicate using communication over power line technology.

The modified electrical device includes internal control circuitry for controlling a flow of electrical current through the modified electrical device such as power conditioning circuitry, dimmers, relays, fuses, circuit breakers, or other circuitry. The active cover plate supplies control signals to the internal control circuitry in the modified electrical device via the at least one connector. For example, the modified electrical device may include step down circuitry to supply a low voltage to the active cover plate via the at least one connector.

In general, the at least one connector is configured to supply power to the active cover plate with a first polarity when the active cover plate is in a first orientation with respect to the modified electrical device and to supply power with the same polarity to the active cover plate when the active cover plate is in a second orientation with respect to the modified electrical device. For example, the first orientation may be a right side up orientation and the second orientation may be an upside down orientation. In one example, the body comprises a switch body and the at least one connection comprises a hot port and a neutral port. The use of a neutral port allows the body to supply electrical power to the active cover plate regardless of whether the light switch is on or off. In one example, an active cover plate that is adapted to be connected over a switch body may include a ground contact that is configured to contact a grounded surface of the switch body. For example the ground contact may be a spring or leaf style contact that is positioned to make an electrical connection to a grounded yoke of the switch body.

In some examples, the modified electrical device is configured to accept both the active cover plate and a standard cover plate that does not include internal circuitry. Additionally or alternatively, the modified electrical device may be configured to accept an active cover plate with prongs that make electrical contact with screw terminals on the sides of the receptacle body.

The connector on the modified electrical device may include female ports adapted to receive male prongs extending from a surface of the active cover plate, wherein the female ports comprise at least two power ports and at least one control port. There may be two connectors on the modified electrical device and/or on the active cover plate. The two connectors may include a first connector and a second connector, wherein the second connector is a horizontally and vertically mirrored copy of the first connector. These connectors allow the modified electrical device to be in two way communication of electrical signals with the active cover plate.

In some examples, the circuitry to support a particular function may be split between the active cover plate and the modified electrical device. For example, an active cover plate may include low voltage circuitry and a first interface and a modified high voltage circuitry and a second interface to connect to the first interface to supply low voltage to the active cover plate. These interfaces may be wired or wireless. For example, the interfaces (ports) may include a power interface, a communication interface, and a control interface. For example, the interface on a modified electrical device may include 6 ports, two power ports, two communication ports, and two control ports. The high voltage circuitry in the outlet body may include a relay or a dimmer controlled by a control signal received from the active cover plate. The modified electrical device may be configured to accept both an active cover plate and a standard cover plate that does not include internal circuitry. The modified electrical device may be in two way communication with an active cover plate. For example, the modified electrical device may report power consumption to the active cover plate which may send a signal to open the relay to turn off the power.

The preceding description has been presented only to illustrate and describe examples of the principles described. This description is not intended to be exhaustive or to limit these principles to any precise form disclosed. Many modifications and variations are possible in light of the above teaching. For example, the number, size, and geometry of the pins/female ports can be selected to best accommodate the system requirements. Further, the functionality of the various devices can be selected and distributed between the active cover plate and the switch body to best meet the needs of the system.

What is claimed is:

1. A system comprising:
    an active cover plate comprising low voltage circuitry and a first interface; and
    a modified switch or outlet electrical device comprising:
        high voltage circuitry connected to at least one controlled device;
        power conditioning circuitry to produce a low voltage;
        a second interface to connect to the first interface; and
        a conductor to connect the power conditioning circuitry to the second interface;
    wherein the low voltage is supplied from the power conditioning circuitry to the active cover plate via the conductor, first interface and second interface; and
    wherein the active cover plate is configured to send a control signal through the first interface and second interface to control a flow of electrical power through the high voltage circuitry to the at least one controlled device.

2. The system of claim 1, wherein the second interface comprises a power port, a communication port, and a control port.

3. The system of claim 1, wherein the modified electrical device is configured to accept both the active cover plate and a standard cover plate that does not include internal circuitry.

4. The system of claim 1, wherein the first interface comprises a first multiconductor connector and a second multiconductor connector, wherein the second connector is a horizontally and vertically mirrored copy of the first connector such that the active cover plate may be mounted in an upside down orientation or a right side up orientation on the modified electrical device.

5. The system of claim 1, wherein the second interface comprises a first multiconductor connector and a second multiconductor connector, wherein the second connector is a horizontally and vertically mirrored copy of the first connector.

6. The system of claim 1, wherein the modified electrical device comprises a switch body and the active cover plate comprises a ground contact configured to contact a grounded surface of the switch body.

7. The system of claim 1, wherein the modified electrical device comprises a switch body and the at least one connection comprises a hot connection and a neutral or ground connection.

8. The system of claim 1, wherein the high voltage circuitry comprises at least one of:
    a relay controlled by the control signal received from the active cover plate; or
    a power monitor sending a signal to the active cover plate.

9. The system of claim 1, wherein the power conditioning circuitry comprises step down circuitry to supply the low voltage to the active cover plate via the conductor, first interface and the second interface.

10. The system of claim 1, wherein the first interface and the second interface are configured to supply power to the active cover plate with a first polarity when the active cover plate is in a first orientation with respect to the modified electrical device and to supply power with the same polarity to the active cover plate when the active cover plate is in a second orientation with respect to the modified electrical device.

11. The system of claim 10, wherein the first orientation is a right side up orientation and the second orientation is an upside down orientation.

12. The system of claim 1, wherein the second interface comprises female ports adapted to receive male prongs of the first interface extending from a surface of the active cover plate, wherein the female ports comprise at least two power ports and at least one control port.

13. The system of claim 1, wherein the modified electrical device comprises a switch body and the at least one second interface comprises a hot port and a neutral port or a ground port.

14. The system of claim 1, wherein the modified electrical device is configured for two way communication of electrical signals with the active cover plate.

15. The system of claim 1, wherein the at least one controlled device comprises one of: a light, a fan, an electric motor and an appliance.

16. A method for controlling a flow of electrical power comprising:
    making electrical contact between an active cover plate and a modified switch or outlet electrical device by pressing a first interface on the active cover plate into a second interface on the modified electrical device;
    wherein the active cover plate comprises low voltage circuitry; and the modified electrical device comprises high voltage circuitry connected to at least one controlled device and power conditioning circuitry to produce a low voltage connected to the second interface by a conductor;
    supplying low voltage from the power conditioning circuitry to the active cover plate through the conductor, the first interface and the second interface;
    generating, with internal circuitry in the active cover plate, a control signal; and
    sending the control signal from the active cover plate through the first interface to the second interface to the high voltage circuitry in the modified electrical device to control a flow of electricity through the high voltage circuitry to the at least one controlled device.

17. The method of claim 16, wherein the high voltage circuitry comprises a relay or a dimmer.

* * * * *